(12) United States Patent
Zeng

(10) Patent No.: US 10,811,339 B2
(45) Date of Patent: Oct. 20, 2020

(54) SEMICONDUCTOR DEVICE AND MANUFACTURING METHOD THEREOF

(71) Applicant: WUHAN XINXIN SEMICONDUCTOR MANUFACTURING CO., LTD., Wuhan, Hubei (CN)

(72) Inventor: Tian Zeng, Hubei (CN)

(73) Assignee: WUHAN XINXIN SEMICONDUCTOR MANUFACTURING CO., LTD., Hubei (CN)

(*) Notice: Subject to any disclaimer, the term of this patent is extended or adjusted under 35 U.S.C. 154(b) by 0 days.

(21) Appl. No.: 16/392,988

(22) Filed: Apr. 24, 2019

(65) Prior Publication Data

US 2020/0075459 A1  Mar. 5, 2020

(30) Foreign Application Priority Data

Aug. 28, 2018  (CN) .......................... 2018 1 0990657

(51) Int. Cl.
*H01L 23/48* (2006.01)
*H01L 21/768* (2006.01)
(Continued)

(52) U.S. Cl.
CPC .......... *H01L 23/481* (2013.01); *H01L 21/762* (2013.01); *H01L 21/76805* (2013.01);
(Continued)

(58) Field of Classification Search
CPC ............... H01L 23/481; H01L 23/3171; H01L 23/5226; H01L 21/762; H01L 21/76805;
(Continued)

(56) References Cited

U.S. PATENT DOCUMENTS

2011/0095395 A1* 4/2011 Ellul ................. H01L 21/76898
257/531
2016/0284755 A1* 9/2016 Shimotsusa ....... H01L 21/76898
(Continued)

FOREIGN PATENT DOCUMENTS

| CN | 104009054 A | 8/2014 |
|---|---|---|
| CN | 105321903 A | 2/2016 |
| CN | 107046043 A | 8/2017 |

*Primary Examiner* — Tong-Ho Kim
(74) *Attorney, Agent, or Firm* — Muncy, Geissler, Olds & Lowe, P.C.

(57) ABSTRACT

A semiconductor device and a manufacturing method thereof are disclosed. In which a uniform metal layer is formed above the second metal layer of the second wafer, the uniform metal layer is electrically connected to the second metal layer, and the uniform metal layer and the first metal layer are made of the same material. The uniform metal layer and the first metal layer simultaneously exposed by the subsequently formed TSV hole are made of the same material, the degree of over-etching is relatively easy to control in the etching process, and cross contamination of cleaning agents in the cleaning process can be avoided. In addition, when the interconnection layer is electrically connected to the first metal layer and the uniform metal layer, since the uniform metal layer and the first metal layer are made of the same material, the interconnection layer has better contact performance with the two.

16 Claims, 6 Drawing Sheets

(51) Int. Cl.
   *H01L 23/522* (2006.01)
   *H01L 25/065* (2006.01)
   *H01L 23/31* (2006.01)
   *H01L 23/532* (2006.01)
   *H01L 29/06* (2006.01)
   *H01L 21/762* (2006.01)
(52) U.S. Cl.
   CPC .. *H01L 21/76897* (2013.01); *H01L 21/76898* (2013.01); *H01L 23/3171* (2013.01); *H01L 23/5226* (2013.01); *H01L 23/53228* (2013.01); *H01L 25/0657* (2013.01); *H01L 29/0649* (2013.01)
(58) Field of Classification Search
   CPC ........... H01L 21/76897; H01L 25/0657; H01L 29/0649; H01L 23/53228; H01L 21/76898
   USPC ........................................................ 257/774
   See application file for complete search history.

(56) References Cited

U.S. PATENT DOCUMENTS

2018/0130743 A1   5/2018  Shigetoshi
2018/0158859 A1*  6/2018  Takahashi ......... H01L 27/14645

* cited by examiner

```
┌─────────────────────────────────────────────────────────────┐
│ Provide a first wafer and a second wafer, where the first wafer includes a │
│ first substrate, a first insulating layer located on the first substrate, a first │
│ metal layer embedded in the first insulating layer and a first passivation │──S1
│ layer located on the first metal layer, the second wafer includes a second │
│ substrate, a second insulating layer located on the second substrate and a │
│ second metal layer embedded in the second insulating layer, and the second │
│ metal layer and the first metal layer are made of different materials │
└─────────────────────────────────────────────────────────────┘
                                 ↓
┌─────────────────────────────────────────────────────────────┐
│ Form a uniform metal layer and a second passivation layer, where the │
│ uniform metal layer is located above the second metal layer and electrically │
│ connected to the second metal layer, the uniform metal layer and the first │──S2
│ metal layer are made of the same material, and the second passivation layer │
│ is located on the uniform metal layer │
└─────────────────────────────────────────────────────────────┘
                                 ↓
┌─────────────────────────────────────────────────────────────┐
│ Bond the first wafer and the second wafer, where the first passivation layer │──S3
│ faces the second passivation layer │
└─────────────────────────────────────────────────────────────┘
                                 ↓
┌─────────────────────────────────────────────────────────────┐
│ Form a TSV hole, where the TSV hole penetrates the first wafer and the │
│ second passivation layer, and the TSV hole is located above the uniform │──S4
│ metal layer and exposes the uniform metal layer and the first metal layer │
└─────────────────────────────────────────────────────────────┘
                                 ↓
┌─────────────────────────────────────────────────────────────┐
│ Form an interconnection layer, where the TSV hole is filled with the │
│ interconnection layer, and the interconnection layer is electrically │──S5
│ connected to the first metal layer and the uniform metal layer │
└─────────────────────────────────────────────────────────────┘
```

Fig. 1

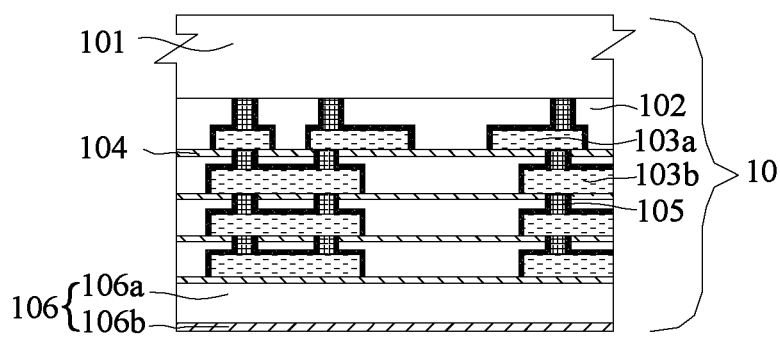

Fig. 2

SEMICONDUCTOR DEVICE AND MANUFACTURING METHOD THEREOF

CROSS-REFERENCE TO RELATED APPLICATION

This application claims the priority of Chinese patent application number 201810990657.5, filed on Aug. 28, 2018, the entire contents of which are incorporated herein by reference.

TECHNICAL FIELD

The present invention pertains to the technical field of integrated circuit manufacturing, and in particular, relates to a semiconductor device and a manufacturing method thereof.

BACKGROUND

TSV (Through Silicon Via) technology is a new technology for interconnecting wafers by fabricating vertical connections between wafers, which enables a higher stack density in three dimensions. In an actual process, inter-wafer interconnection is often achieved by filling a TSV hole with an interconnection layer, so that the interconnection layer is respectively electrically connected to metal layers of different wafers that are simultaneously exposed in the TSV hole. However, different wafers to be interconnected may contain metal layers made of different materials (for example, one wafer contains a metal layer made of copper, and the other wafer contains a metal layer made of aluminum). The inventors have found that this increases the difficulty of the etching process, leads to cross contamination in the cleaning process, and tends to cause poor contact performance between the interconnection layer and the metal layers.

SUMMARY OF THE INVENTION

An objective of the present invention is to reduce the difficulty of an etching process for simultaneously exposing metal layers of different wafers.

Another objective of the present invention is to solve the problem of cross contamination caused by the cleaning process.

Still another objective of the present invention is to improve the contact performance of the interconnection layer with the metal layers and enhance the stability of the semiconductor device.

In order to solve the above technical problems, the present invention provides a manufacturing method of a semiconductor device, including:

providing a first wafer and a second wafer, wherein the first wafer includes a first substrate, a first insulating layer located on the first substrate, a first metal layer embedded in the first insulating layer and a first passivation layer located above the first metal layer, wherein the second wafer includes a second substrate, a second insulating layer located on the second substrate and a second metal layer embedded in the second insulating layer, and the second metal layer and the first metal layer being made of different materials;

forming a uniform metal layer and a second passivation layer, wherein the uniform metal layer is located above the second metal layer and electrically connected to the second metal layer, the uniform metal layer and the first metal layer being made of a same material, and the second passivation layer located on the uniform metal layer;

bonding the first wafer and the second wafer with the first passivation layer facing the second passivation layer;

forming a TSV hole, wherein the TSV hole penetrates through the first wafer and the second passivation layer until reaching the uniform metal layer, the TSV hole exposing the uniform metal layer and the first metal layer; and filling an interconnection layer in the TSV hole, so that the interconnection layer is electrically connected to the first metal layer and the uniform metal layer.

Optionally, in the manufacturing method of a semiconductor device, forming a uniform metal layer includes:

forming a first isolation layer, wherein the first isolation layer covers the second metal layer;

forming a contact hole, wherein the contact hole penetrates through the first isolation layer and is located above the second metal layer;

forming a plug, wherein the contact hole is filled with the plug and the plug is electrically connected to the second metal layer;

forming a second isolation layer, wherein the second isolation layer covers the first isolation layer and the plug;

forming an opening, wherein the opening penetrates through the second isolation layer and is located above the plug;

forming a uniform metal layer, wherein the opening is filled with the uniform metal layer and the uniform metal layer covers a surface of the second isolation layer;

and performing a chemical mechanical polishing process to remove a portion of the uniform metal layer on the surface of the second isolation layer.

Optionally, in the manufacturing method of a semiconductor device, the second wafer further includes a third passivation layer.

Optionally, in the manufacturing method of a semiconductor device, before forming the uniform metal layer and the second passivation layer, the method further includes: etching away the third passivation layer to expose the second metal layer.

Optionally, in the manufacturing method of a semiconductor device, forming a TSV hole includes:

forming a first opening, wherein the first opening penetrates through a portion of the first substrate;

forming a second opening, wherein the second opening penetrates through the first wafer and the second passivation layer and exposes the uniform metal layer, the second opening communicating with the first opening; and forming a third opening, wherein the third opening penetrates through the first substrate and a portion of the first insulating layer to expose a portion of the first metal layer, the third opening communicating with the first opening and the second opening.

Optionally, in the manufacturing method of a semiconductor device, a size of the third opening is greater than a size of the second opening and smaller than a size of the first opening.

Optionally, in the manufacturing method of a semiconductor device, before forming the interconnection layer, the method further includes: forming a barrier layer, wherein the barrier layer covers side walls and a bottom surface of the TSV hole and exposes the first metal layer.

Optionally, in the manufacturing method of a semiconductor device, the interconnection layer is a copper interconnection layer, and the step of forming the interconnection layer specifically includes:

forming a copper interconnection layer by electroplating, wherein the TSV hole is filled with the copper interconnection layer and covers a surface of the first substrate; and performing a chemical mechanical polishing process to remove the copper interconnection layer on the surface of the first substrate.

Optionally, in the manufacturing method of a semiconductor device, the interconnection layer is a copper interconnection layer, and the step of forming the interconnection layer specifically includes:

inserting a plurality of copper core solder balls having a diameter corresponding to the diameter of the TSV hole into the TSV hole; and melting and reflowing the copper core solder balls to fill the TSV hole.

The present invention further provides a semiconductor device, including: a first wafer, wherein the first wafer includes a first substrate, a first insulating layer located on the first substrate, a first metal layer embedded in the first insulating layer and a first passivation layer located above the first metal layer; a second wafer, wherein the second wafer includes a second substrate, a second insulating layer located on the second substrate, a second metal layer embedded in the second insulating layer, a uniform metal layer located above the second metal layer and electrically connected to the second metal layer, and a second passivation layer located on the uniform metal layer, the second metal layer and the first metal layer are made of different materials, the uniform metal layer and the first metal layer are made of a same material, and the first passivation layer is bonded to the second passivation layer; a TSV hole, wherein the TSV hole penetrates through the first wafer and the second passivation layer, and the TSV hole is located above the uniform metal layer; and an interconnection layer, wherein the TSV hole is filled with the interconnection layer, and the interconnection layer is electrically connected to the first metal layer and the uniform metal layer.

Optionally, in the semiconductor device, the second wafer further includes a first isolation layer covering the second metal layer, a contact hole penetrating through the first isolation layer and located above the second metal layer, a plug with which the contact hole is filled and which is electrically connected to the second metal layer, a second isolation layer covering the first isolation layer and the plug, and an opening penetrating through the second isolation layer and located above the plug, and the opening is filled with the uniform metal layer.

Optionally, in the semiconductor device, the TSV hole includes:

a first opening, wherein the first opening penetrates through a portion of the first substrate;

a second opening, wherein the second opening communicates with the first opening, and the second opening penetrates through the first wafer and the second passivation layer and is located above the uniform metal layer; and a third opening, wherein the third opening communicates with the first opening and the second opening, and the third opening penetrates through the first substrate and a portion of the first insulating layer to expose a portion of the first metal layer.

Optionally, in the semiconductor device, a size of the third opening is greater than a size of the second opening and smaller than a size of the first opening.

Optionally, the semiconductor device further includes a barrier layer, wherein the barrier layer covers side walls and a bottom surface of the TSV hole and exposes the first metal layer.

Optionally, in the semiconductor device, the first passivation layer includes a first passivation layer first portion located above the first metal layer and a first passivation layer second portion located on the first passivation layer first portion.

Optionally, in the semiconductor device, the first passivation layer first portion is a silicon oxide layer and the first passivation layer second portion is a silicon nitride layer.

Optionally, in the semiconductor device, the second passivation layer includes a second passivation layer first portion located on the uniform metal layer and a second passivation layer second portion located on the second passivation layer first portion.

Optionally, in the semiconductor device, the second passivation layer first portion is a silicon oxide layer and the second passivation layer second portion is a silicon nitride layer.

Compared with the prior art, in the present invention, a uniform metal layer is formed above the second metal layer of the second wafer, the uniform metal layer is electrically connected to the second metal layer, and the uniform metal layer and the first metal layer are made of the same material. Thus, the uniform metal layer and the first metal layer simultaneously exposed by the subsequently formed TSV hole are made of the same material, the degree of overetching is relatively easy to control in the etching process, and cross contamination of cleaning agents in the cleaning process can be avoided. In addition, when the interconnection layer is electrically connected to the first metal layer and the uniform metal layer, since the uniform metal layer and the first metal layer are made of the same material, the interconnection layer has better contact performance with the two.

BRIEF DESCRIPTION OF DRAWINGS

FIG. 1 is a flow chart of a manufacturing method of a semiconductor device according to the present invention;

FIG. 2 is a schematic cross-sectional view of a first wafer according to an embodiment of the present invention;

Figure 3A:
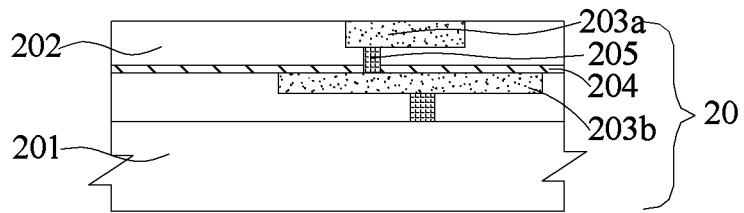
FIG. 3a is a schematic cross-sectional view of a second wafer according to an embodiment of the present invention.

The reference signs are as follows:
- 10—first wafer;
- 101—first substrate; 102—first insulating layer; 103a—first metal layer; 103b—first intermediate metal layer; 104—first etching stopping layer; 105—first plug; 106—first passivation layer; 106a—first passivation layer first portion; 106b—first passivation layer second portion;
- 20—second wafer;
- 201—second substrate; 202—second insulating layer; 203a—second metal layer; 203b—second intermediate metal layer; 204—second etching stopping layer; 205—second tungsten plug; 206—first isolation layer; 207—second isolation layer; 208—uniform metal layer; 209—second passivation layer; 209a—second passivation layer first portion; 209b—second passivation layer second portion; 210—third passivation layer; 210a—third passivation layer first portion; 210b—third passivation layer second portion;
- 30—bonding interface;
- 41—barrier layer; 42—interconnection layer;
- 51—contact hole; 52—opening;
- 61—first opening; 62—second opening; 63—third opening.

DETAILED DESCRIPTION OF EXEMPLARY EMBODIMENTS

As described in the background art, the inventors have found that different wafers to be interconnected may contain metal layers made of different materials. This increases the difficulty of the etching process, leads to cross contamination of the cleaning process, and tends to cause poor contact performance between the interconnection layer and the metal layer.

Specifically, when an etching process is used to simultaneously expose metal layers of different wafers made of different materials, an etchant is firstly used to remove the passivation layer on each metal layer of different wafers so as to expose the metal layer. In order to ensure sufficient exposure, a portion of the metal layer is usually etched away by an over-etching process. Since the metal layers made of different materials are etched at different rates during the etching, it is difficult to control the degree of etching of different metal layers in the process, which increases the difficulty of the etching process.

In another aspect, metal layers made of different materials (such as aluminum and copper) are exposed simultaneously. In the subsequent cleaning process, since different metals have different requirements on the composition of the cleaning agent, for example, when the cleaning of the copper metal layer is satisfied, the aluminum metal layer may not be effectively cleaned, and if the cleaning of the aluminum metal layer is satisfied, the copper may not be effectively cleaned, and the cross contamination may be caused when different cleaning agents satisfying the aluminum metal layer and the copper metal layer are used respectively.

In still another aspect, when the interconnection layer is in contact with a metal layer made of a different material, it is often impossible to simultaneously take into consideration the requirements of the metal layers made of different materials. When the interconnection layer satisfies the contact performance with the metal layer made of one material, it is highly likely that there is a problem of poor contact performance with the metal layer made of another material.

After intensive research, in view of the above, the present invention provides a semiconductor device and a manufacturing method thereof. A uniform metal layer is formed above the second metal layer of the second wafer, and the uniform metal layer is electrically connected to the second metal layer. Thus, the uniform metal layer and the first metal layer simultaneously exposed by the subsequently formed TSV hole are made of the same material, the degree of over-etching is relatively easy to control in the etching process, and cross contamination of cleaning agents in the cleaning process can be avoided. In addition, when the interconnection layer is electrically connected to the first metal layer and the uniform metal layer, the two have better contact performance with the interconnection layer.

Hereinafter, a semiconductor device and a manufacturing method thereof according to the present invention will be further described in detail with reference to the accompanying drawings and specific embodiments. Advantages and features of the present invention will become more apparent from the description. It should be noted that the drawings are in a very simplified form and are used in a non-precise scale, and are merely for convenience and clarity of the purpose of the embodiments of the present invention.

As shown in FIG. 1, the manufacturing method of a semiconductor device according to an embodiment of the present invention includes:

S1: providing a first wafer and a second wafer, wherein the first wafer includes a first substrate, a first insulating layer located on the first substrate, a first metal layer embedded in the first insulating layer and a first passivation layer located on the first metal layer, the second wafer includes a second substrate, a second insulating layer located on the second substrate and a second metal layer embedded in the second insulating layer, and the second metal layer and the first metal layer are made of different materials;

S2: forming a uniform metal layer and a second passivation layer, wherein the uniform metal layer is located above the second metal layer and electrically connected to the second metal layer, the uniform metal layer and the first metal layer are made of the same material, and the second passivation layer is located on the uniform metal layer;

S3: bonding the first wafer and the second wafer, wherein the first passivation layer faces the second passivation layer;

S4: forming a TSV hole, wherein the TSV hole penetrates through the first wafer and the second passivation layer, and the TSV hole is located above the uniform metal layer and exposes the uniform metal layer and the first metal layer; and S5: forming an interconnection layer, wherein the TSV hole is filled with the interconnection layer, and the interconnection layer is electrically connected to the first metal layer and the uniform metal layer.

It should be noted that the present invention does not limit which wafer of the first wafer and the second wafer must be placed above/below, but the positions of the upper and lower wafers can be interchanged. Herein, for the sake of simplicity and convenience of description, only one positional relationship of the two wafers is shown. Those skilled in the art can understand that all the technical contents described herein are also applicable to the case where the positions of the "first wafer" and the "second wafer" are reversed up and down. At this time, the positional relationship of the layers of the stacked semiconductor device is also reversed up and down accordingly. In some cases, preferably, during a bonding process on two wafers, a wafer having a relatively large wafer bow is placed below. However, in this case, after the wafer bonding is completed, it is also possible to determine whether to reverse up and down according to actual needs, thereby ultimately determining which wafer is above and which wafer is below.

It is to be noted that the terms "first", "second", "third", "fourth" and the like are used herein to distinguish different components or techniques having the same name, and do not mean a sequence or a positional relationship or the like. In addition, for different components having the same name, such as "first substrate" and "second substrate", "first passivation layer" and "second passivation layer", etc., it does not mean that they have the same structure or components. For example, although not shown in the drawings, in most cases, the components formed in the "first substrate" and the "second substrate" are different, and the structures of the substrates may be different. In some implementations, the substrate may be a semiconductor substrate made of any semiconductor material (e.g., Si, SiC, SiGe, etc.) suitable for a semiconductor device. In other implementations, the substrate may also be a composite substrate such as silicon-on-insulator (SOI), silicon germanium-on-insulator, or the like. Those skilled in the art will understand that the substrate is not subject to any restrictions, but may be selected according to practical applications. Various device structures (not limited to semiconductor device structures) such as a gate structure and the like can be formed in the substrate.

Hereinafter, a semiconductor device and a manufacturing method thereof according to embodiments of the present invention will be described in more detail with reference to FIG. 2 to FIG. 11.

In step S1, a first wafer 10 and a second wafer 20 are provided.

As shown in FIG. 2, the first wafer 10 is provided. The first wafer 10 includes a first substrate 101, a first insulating layer 102 located on the first substrate 101, a first metal layer 103a embedded in the first insulating layer 102 and a first passivation layer 106 located above the first metal layer 103a.

Further, the first passivation layer 106 may include a first passivation layer first portion 106a located above the first metal layer 103a and a first passivation layer second portion 106b located on the first passivation layer first portion 106a. The first passivation layer second portion 106b is, for example, a silicon nitride layer. The silicon nitride layer has good compactness and is a hard film which can well protect the surface of the semiconductor device. The first passivation layer first portion 106a is, for example, a silicon oxide layer. The silicon oxide layer has good coverage, and can well protect the first metal layer 103a while alleviating the stress caused by the silicon nitride layer.

As shown in FIG. 3a, the second wafer 20 includes a second substrate 201, a second insulating layer 202 located on the second substrate 201 and a second metal layer 203a embedded in the second insulating layer 202. The second metal layer 203a and the first metal layer 103a are made of different materials.

Figure 3B:
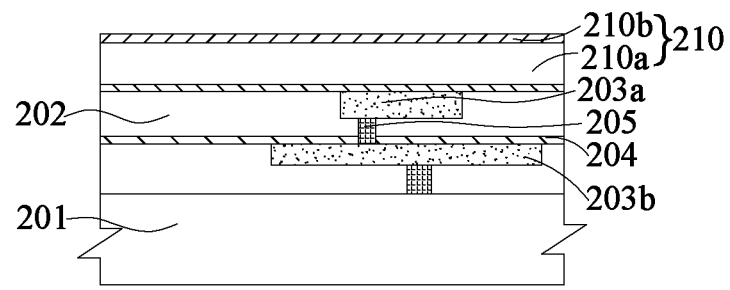
FIG. 3b is a schematic cross-sectional view of a second wafer after a third passivation layer is formed according to an embodiment of the present invention.

Further, the second wafer 20 may be fabricated by using a ready-made wafer after the third passivation layer is formed. At this time, as shown in FIG. 3b, the second wafer 20 further includes a third passivation layer 210, and the third passivation layer 210 is located on the second metal layer 203a. Before forming the uniform metal layer and the second passivation layer, the third passivation layer 210 may be etched away to expose the second metal layer 203a.

The third passivation layer 210 may include a third passivation layer first portion 210a located on the second metal layer 203a and a third passivation layer second portion 210b located on the third passivation layer first portion 210a. The third passivation layer second portion 210b is, for example, a silicon nitride layer, and the third passivation layer first portion 210a is, for example, a silicon oxide layer.

In this embodiment, the second metal layer 203a and the first metal layer 103a are made of different materials. The first metal layer 103a is made of, for example, copper, and the second metal layer 203a is made of, for example, aluminum.

As shown in FIG. 2, the first wafer 10 may further include a first etching stopping layer 104. The first etching stopping layer 104 is located between the first metal layer 103a and the first passivation layer 106.

Further, the first wafer 10 further includes a plurality of first intermediate insulating layers located between the first insulating layer 102 and the first passivation layer 106; a first intermediate metal layer 103b embedded in each of the first intermediate insulating layer; a first intermediate etching stopping layer located between the adjacent first intermediate insulating layers; and first plugs 105. The first plugs 105 are respectively located between the adjacent first intermediate metal layers and between the first metal layer 103a and the first substrate 101. Each first plug 105 is, for example, a tungsten plug, which can well realize electrical connection between the adjacent intermediate metal layers and electrical connection between the first metal layer 103a and the first substrate 101. In this case, it can be understood that the first metal layer 103a is the metal layer closest to the first substrate 101 in the first wafer 10.

Further, the second wafer 20 further includes a plurality of second intermediate insulating layers located between the second insulating layer 202 and the second substrate 201; a second intermediate metal layer 203b embedded in each of the second intermediate insulating layers; a second etching stopping layer 204 located between the adjacent second intermediate insulating layers; and second plugs 205 are respectively located between the adjacent second intermediate metal layers. Each second plug 205 is, for example, a tungsten plug, which can well realize electrical connection between the adjacent second intermediate metal layers. In this case, it can be understood that the second metal layer 203a is the metal layer farthest from the second substrate 201 in the second wafer 20. At the same time, after the first wafer 10 and the second wafer 20 are bonded, the second metal layer 203a is the metal layer closest to the first substrate 101 in the second wafer 20.

In step S2, a uniform metal layer and a second passivation layer are formed. The step of forming the uniform metal layer and the second passivation layer will be described in detail below with reference to FIG. 4 to FIG. 6.

Figure 4:
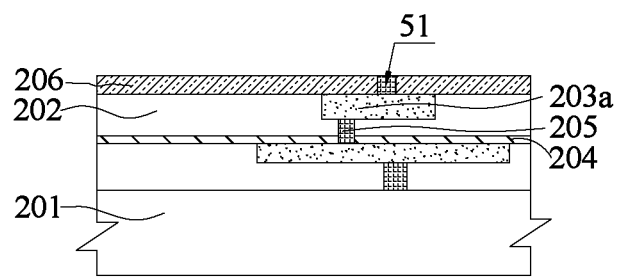
FIG. 4 is a schematic cross-sectional view of a second wafer after a contact hole is formed and filled with a plug according to an embodiment of the present invention.

First, as shown in FIG. 4, a first isolation layer 206 is formed, where the first isolation layer 206 covers the second metal layer 203a, and the first isolation layer 206 may be a silicon oxide layer; then, a contact hole 51 is formed, where the contact hole 51 penetrates through the first isolation layer 206 and is located on the second metal layer 203a; and then, a plug is formed, where the contact hole 51 is filled with the plug and the plug is electrically connected to the second metal layer 203a, and the plug is, for example, a tungsten plug.

Figure 5:
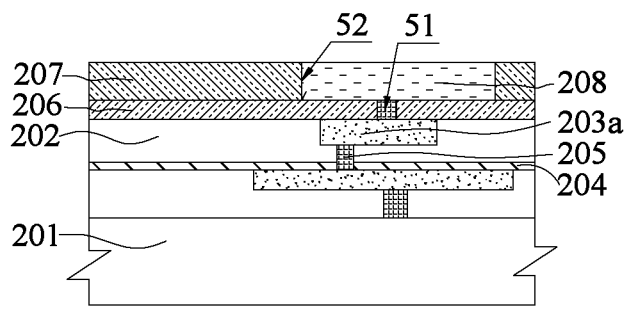
FIG. 5 is a schematic cross-sectional view of a second wafer after a uniform metal layer is formed according to an embodiment of the present invention.

Next, as shown in FIG. 5, a second isolation layer 207 is formed, where the second isolation layer 207 covers the first isolation layer 206; then, an opening 52 is formed, where the opening 52 penetrates through the second isolation layer 207 and is located on the contact hole 51; then, a uniform metal layer 208 is formed, where the uniform metal layer 208 and the first metal layer 103a are made of the same material, and the opening 52 is filled with the uniform metal layer 208 and the uniform metal layer 208 covers the surface of the second isolation layer 207; and finally, a chemical mechanical polishing process is performed to remove the portion of the uniform metal layer on the surface of the second isolation layer 207. Thus, the uniform metal layer 208 is electrically connected to the second metal layer 203a via the plug in the contact hole 51.

Figure 6:
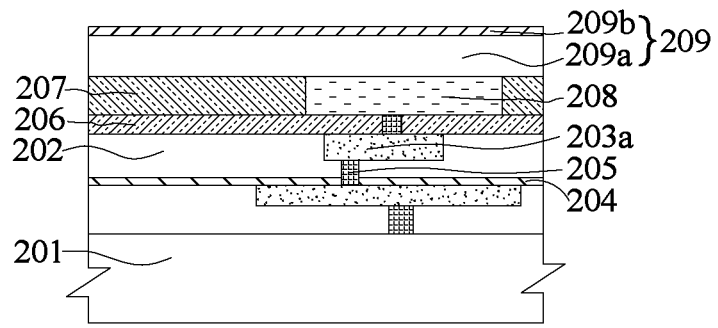
FIG. 6 is a schematic cross-sectional view of a second wafer after a second passivation layer is formed according to an embodiment of the present invention.

Next, as shown in FIG. 6, a second passivation layer 209 is formed on the surface of the second isolation layer 207. The second passivation layer 209 may include a second passivation layer first portion 209a located on the uniform metal layer 208 and a second passivation layer second portion 209b located on the second passivation layer first portion 209a. The second passivation layer second portion 209b is, for example, a silicon nitride layer. The silicon nitride layer has good compactness and is a hard film which can well protect the surface of the semiconductor device. The second passivation layer first portion 209a is, for example, a silicon oxide layer. The silicon oxide layer has good coverage, and can well protect the uniform metal layer 208 while alleviating the stress caused by the silicon nitride layer.

Figure 7:
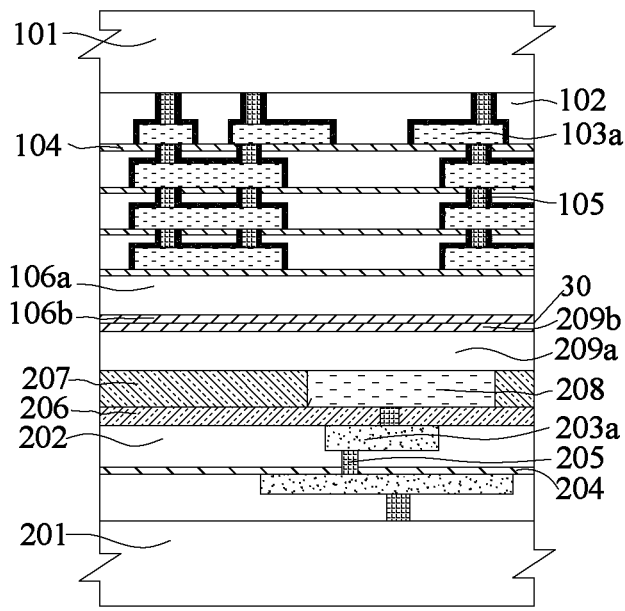
FIG. 7 is a schematic cross-sectional view of a first wafer and a second wafer bonded together according to an embodiment of the present invention.

In step S3, as shown in FIG. 7, the first wafer 10 and the second wafer 20 are bonded. The first passivation layer second portion 106b faces (is bonded to) the second passivation layer second portion 209b to form a bonding interface 30.

In step S4, a TSV hole is formed. The step of forming the TSV hole will be described in detail below with reference to FIG. 8 to FIG. 10.

Figure 8:
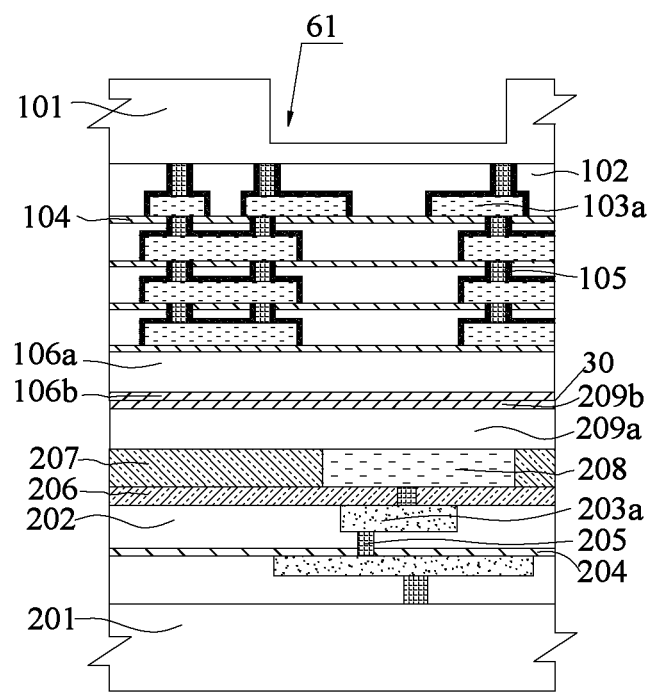
FIG. 8 is a schematic cross-sectional view of a first wafer and a second wafer bonded together after a first opening is formed according to an embodiment of the present invention.

As shown in FIG. 8, a first opening 61 is formed, where the first opening 61 penetrates through a portion of the first substrate 101.

Figure 9:
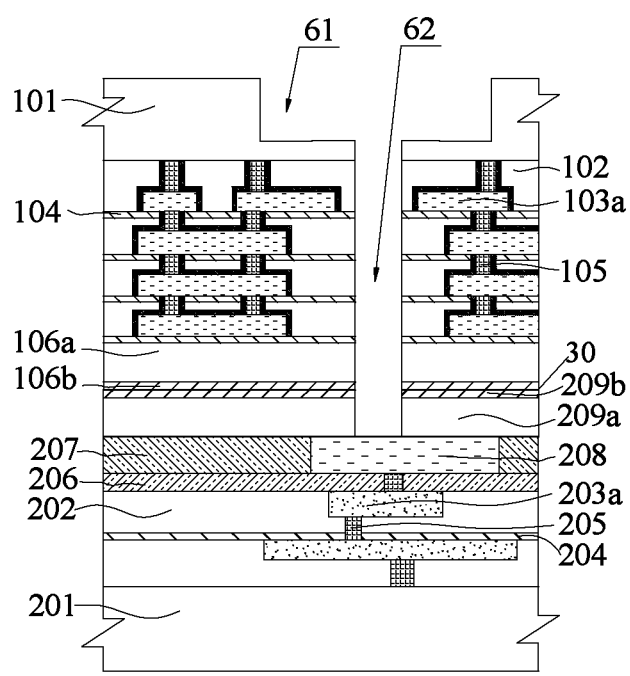
FIG. 9 is a schematic cross-sectional view of a first wafer and a second wafer bonded together after a second opening is formed according to an embodiment of the present invention.

As shown in FIG. 9, a second opening 62 is formed, where the second opening 62 communicates with the first opening 61, and the second opening 62 penetrates through the first wafer 10 and the second passivation layer 209 and is located above (exposes) the uniform metal layer 208.

Figure 10:
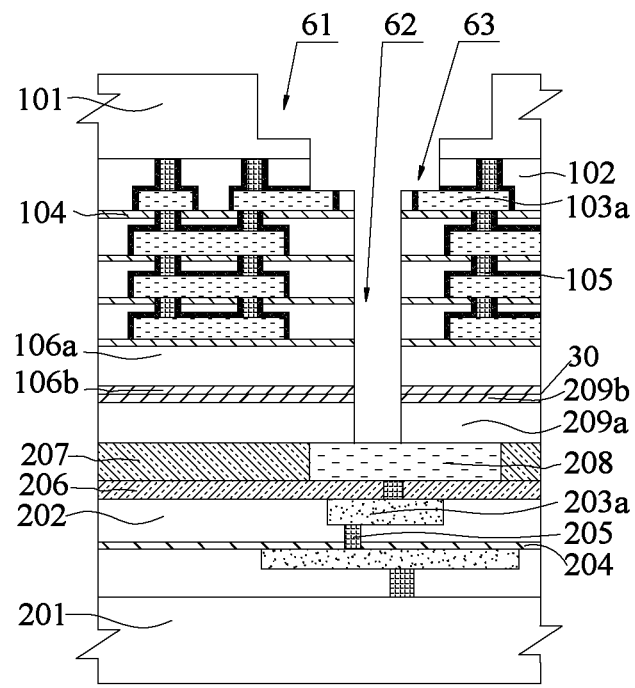
FIG. 10 is a schematic cross-sectional view of a first wafer and a second wafer bonded together after a third opening is formed according to an embodiment of the present invention.

As shown in FIG. 10, a third opening 63 is formed, where the third opening 63 communicates with the first opening 61 and the second opening 62. The size of the third opening 63 is greater than the size of the second opening 62 and smaller than the size of the first opening 61. The third opening 63 penetrates through the first substrate 101 and a portion of the first insulating layer 102 to expose the first metal layer 103a.

The first opening 61, the second opening 62 and the third opening 63 are combined to form the TSV hole. The TSV hole penetrates through the first wafer 10 and the second passivation layer 209, and the TSV hole is located above the uniform metal layer 208.

Figure 11:
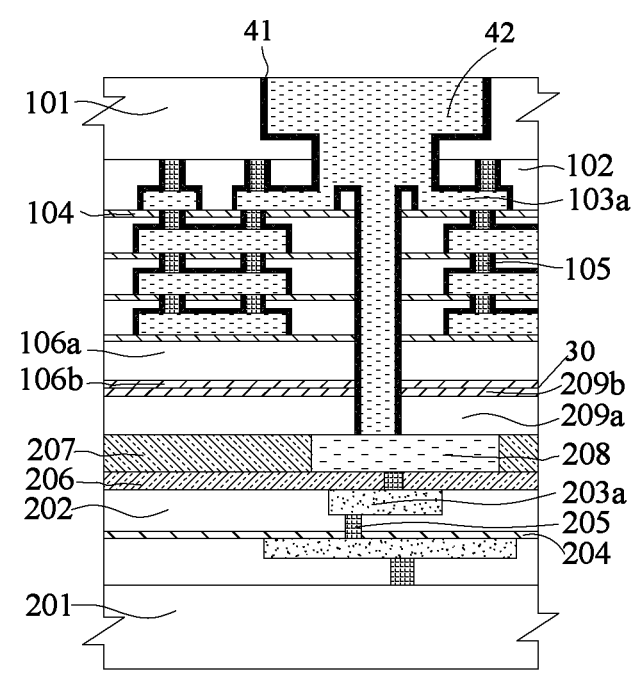
FIG. 11 is a schematic cross-sectional view of a first wafer and a second wafer bonded together after an interconnection layer is formed according to an embodiment of the present invention.

In step S4, as shown in FIG. 11, an interconnection layer 42 is formed.

Before forming the interconnection layer 42, a barrier layer 41 is preferably formed, where the barrier layer 41 covers side walls and a bottom surface of the TSV hole and exposes the first metal layer 103a. The barrier layer 41 may be formed by magnetron sputtering or PECVD, and the material of the barrier layer 41 is, for example, any one or more of Ta, TaN/Ta, Ti, TiN, TiN/Ti, TiW and Cr.

The magnetron sputtering uses a high ionized metal plasma magnetron sputtering technique. The use of a high peak power DC pulsed power supply can produce a higher plasma density and a higher deposition rate than the conventional magnetron sputtering technique, and the metal ions are attracted into the high depth-to-width ratio TSV hole with higher momentum and directivity than the non-ionized metal, so that the metal can be sputtered from the bottom of the TSV hole to the sidewalls of the TSV hole. Thus, after the compact and continuous barrier layer 41 required by electroplating is produced, the barrier layer on the bottom of the third opening 63 of the TSV hole is selectively etched away to expose the uniform metal layer 208 on the bottom of the third opening 63. Meanwhile, a portion of the barrier layer on the bottom of the second opening 62 is removed to expose a portion of the first metal layer 103a on the bottom of the second opening 62.

After forming the barrier layer 41, as shown in FIG. 11, an interconnection layer 42 is formed. The interconnection layer 42 is, for example, a copper interconnection layer. The TSV hole is filled with the interconnection layer 42, and the interconnection layer 42 is electrically connected to the first metal layer 103a and the uniform metal layer 208. The TSV hole may be filled by a copper electroplating process while copper covers the surface of the first substrate 101, and the copper on the surface of the first substrate 101 is removed by a chemical mechanical polishing process and planarized to form the interconnection layer 42. The TSV hole may also be filled by a copper core solder ball process. A plurality of copper core solder balls having a diameter corresponding to the diameter of the TSV hole is placed in the TSV hole, and the copper core solder balls are melted and reflowed in air at a preset temperature to fill the TSV hole.

Figure 12:
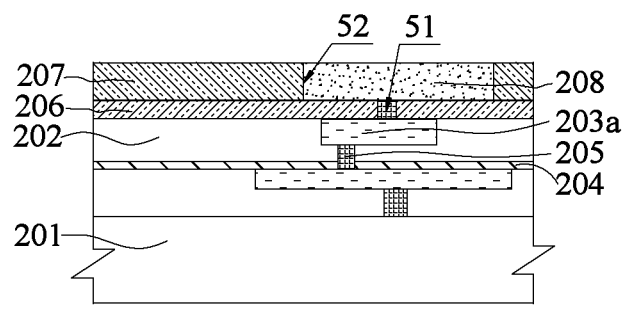
FIG. 12 is a schematic cross-sectional view of a second metal layer of a second wafer made of copper after a uniform metal layer made of aluminum is formed according to another second embodiment of the present invention.
Figure 13:
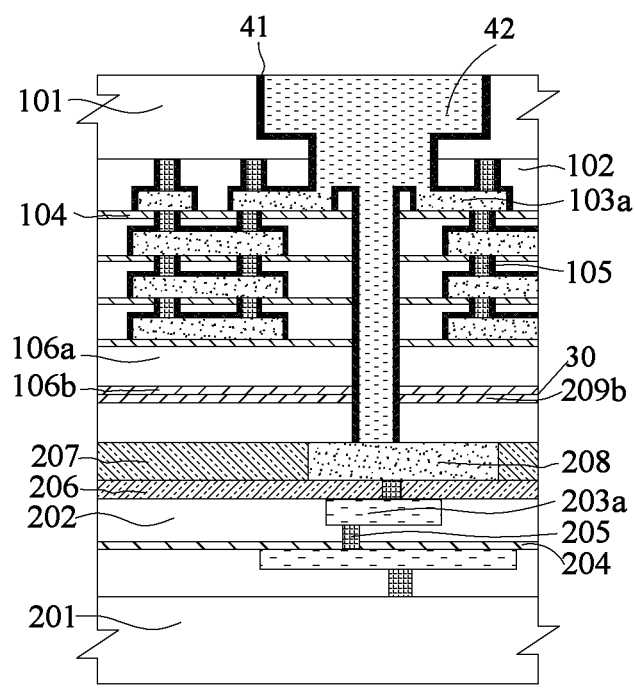
FIG. 13 is a schematic cross-sectional view of the first metal layer and the uniform metal layer both made of aluminum after interconnection according to another embodiment of the present invention.

In addition, as shown in FIG. 12 and FIG. 13, an embodiment of a manufacturing method of a semiconductor device of the present invention may further be as follows: the second metal layer 203a and the first metal layer 103a are made of different materials, the first metal layer 103a is made of aluminum, the second metal layer 203a is made of copper, and the uniform metal layer 208 and the first metal layer 103a are made of the same material aluminum. When the uniform metal layer 208 is made of aluminum, the opening 52 is filled and the surface of the second isolation layer 207 is covered, and a reverse etching aluminum process is performed to remove the uniform metal layer 208 on the surface of the second isolation layer 207.

Next, as shown in FIG. 2, FIG. 6 and FIG. 11, an embodiment of the present invention further provides a semiconductor device, including:

a first wafer 10, wherein the first wafer 10 includes a first substrate 101, a first insulating layer 102 located on the first substrate 101, a first metal layer 103a embedded in the first insulating layer 102 and a first passivation layer 106 located above the first metal layer 103a;

a second wafer 20, wherein the second wafer 20 includes a second substrate 201, a second insulating layer 202 located on the second substrate 201, a second metal layer 203a embedded in the second insulating layer 202, a uniform metal layer 208 located above the second metal layer 203a and electrically connected to the second metal layer 203a, and a second passivation layer 209 located on the uniform metal layer 208. The second metal layer 203a and the first metal layer 103a are made of different materials, the uniform metal layer 208 and the first metal layer 103a are made of the same material, and the first passivation layer 106 is bonded to the second passivation layer 209;

a TSV hole, wherein the TSV hole penetrates through the first wafer 10 and the second passivation layer 209, and the TSV hole is located above the uniform metal layer 208; and an interconnection layer 42, wherein the TSV hole is filled with the interconnection layer 42, and the interconnection layer 42 is electrically connected to the first metal layer 103a and the uniform metal layer 208.

Further, the second wafer 20 further includes a first isolation layer 206 covering the second metal layer 203a, a contact hole 51 penetrating through the first isolation layer 206 and located above the second metal layer 203a, a plug with which the contact hole is filled and which is electrically connected to the second metal layer 203a, a second isolation layer 207 covering the first isolation layer 206 and the plug, and an opening penetrating through the second isolation layer 207 and located above the plug, and the opening is filled with the uniform metal layer 208.

Further, the TSV hole includes: a first opening 61, where the first opening 61 penetrates through a portion of the first substrate 101; a second opening 62, where the second opening 62 communicates with the first opening 61, and the second opening 62 penetrates through the first wafer 10 and the second passivation layer 209 and is located above the uniform metal layer 208; and a third opening 63, where the third opening 63 communicates with the first opening 61 and the second opening 62. The size of the third opening 63 is greater than the size of the second opening 62 and smaller than the size of the first opening 61. The third opening 63 penetrates through the first substrate 101 and a portion of the first insulating layer 102 to expose the first metal layer 103a.

In summary, in the present invention, a uniform metal layer electrically connected to the second metal layer is formed above the second metal layer of the second wafer. Thus, the uniform metal layer and the first metal layer simultaneously exposed by the subsequently formed TSV hole are made of the same material, the degree of over-etching is relatively easy to control in the etching process, and cross contamination of cleaning agents in the cleaning process can be avoided. In addition, when the interconnection layer is electrically connected to the first metal layer and the uniform metal layer, since the uniform metal layer and the first metal layer are made of the same material, the interconnection layer has better contact performance with the two.

Each embodiment in the specification is mainly described as being different from the other embodiments, and the same or similar parts in the embodiments may be referred to each other. For the device structure disclosed in the embodiment, since it corresponds to the method disclosed in the embodiment, the description is relatively simple, and the relevant parts can be referred to the description of the method.

The above description is only for the description of the preferred embodiments of the present invention, and is not intended to limit the scope of the present invention. Any changes and modifications made by those skilled in the art in light of the above disclosure are all within the scope of the appended claims.

What is claimed is:

1. A manufacturing method of a semiconductor device, comprising:
   providing a first wafer and a second wafer, wherein the first wafer comprises a first substrate, a first insulating layer located on the first substrate, a first metal layer embedded in the first insulating layer and a first passivation layer located above the first metal layer, wherein the second wafer comprises a second substrate, a second insulating layer located on the second substrate and a second metal layer embedded in the second insulating layer, and the second metal layer and the first metal layer being made of different materials;
   forming a uniform metal layer and a second passivation layer, wherein the uniform metal layer is located above the second metal layer and electrically connected to the second metal layer, the uniform metal layer and the first metal layer being made of a same material, and the second passivation layer located on the uniform metal layer;
   bonding the first wafer and the second wafer with the first passivation layer facing the second passivation layer;
   forming a through silicon via (TSV) hole, wherein the TSV hole penetrates through the first wafer and the second passivation layer until reaching the uniform metal layer, the TSV hole exposing the uniform metal layer and the first metal layer; and
   filling an interconnection layer in the TSV hole, so that the interconnection layer is electrically connected to the first metal layer and the uniform metal layer.

2. The manufacturing method of a semiconductor device according to claim 1, wherein forming a uniform metal layer comprises:
   forming a first isolation layer, wherein the first isolation layer covers the second metal layer;
   forming a contact hole, wherein the contact hole penetrates through the first isolation layer and is located above the second metal layer;
   forming a plug, wherein the contact hole is filled with the plug and the plug is electrically connected to the second metal layer;
   forming a second isolation layer, wherein the second isolation layer covers the first isolation layer and the plug;
   forming an opening, wherein the opening penetrates through the second isolation layer and is located above the plug;
   forming a uniform metal layer material, wherein the opening is filled with the uniform metal layer material and the uniform metal layer material covers a surface of the second isolation layer; and
   performing a chemical mechanical polishing process to remove a portion of the uniform metal layer material on the surface of the second isolation layer.

3. The manufacturing method of a semiconductor device according to claim 1, wherein the second wafer further comprises a third passivation layer.

4. The manufacturing method of a semiconductor device according to claim 3, wherein before forming the uniform metal layer and the second passivation layer, the method further comprises:

etching away the third passivation layer to expose the second metal layer.

5. The manufacturing method of a semiconductor device according to claim 1, wherein forming a TSV hole comprises:
   forming a first opening, wherein the first opening penetrates through a portion of the first substrate;
   forming a second opening, wherein the second opening penetrates through the first wafer and the second passivation layer and exposes the uniform metal layer, the second opening communicating with the first opening; and
   forming a third opening, wherein the third opening penetrates through the first substrate and a portion of the first insulating layer to expose a portion of the first metal layer, the third opening communicating with the first opening and the second opening.

6. The manufacturing method of a semiconductor device according to claim 5, wherein a size of the third opening is greater than a size of the second opening and smaller than a size of the first opening.

7. The manufacturing method of a semiconductor device according to claim 1, wherein before forming the interconnection layer, the method further comprises:
   forming a barrier layer, wherein the barrier layer covers side walls and a bottom surface of the TSV hole and exposes the first metal layer.

8. The manufacturing method of a semiconductor device according to claim 1, wherein the interconnection layer is a copper interconnection layer, forming the interconnection layer comprising:
   forming a copper interconnection layer by electroplating, wherein the TSV hole is filled with the copper interconnection layer and the copper interconnection layer covers a surface of the first substrate; and
   performing a chemical mechanical polishing process to remove the copper interconnection layer on the surface of the first substrate.

9. The manufacturing method of a semiconductor device according to claim 1, wherein the interconnection layer is a copper interconnection layer, forming the interconnection layer comprising:
   inserting a plurality of copper core solder balls having a diameter corresponding to a diameter of the TSV hole into the TSV hole; and
   melting and reflowing the copper core solder balls to fill the TSV hole.

10. A semiconductor device, comprising:
    a first wafer, wherein the first wafer comprises a first substrate, a first insulating layer located on the first substrate, a first metal layer embedded in the first insulating layer and a first passivation layer located above the first metal layer;
    a second wafer, wherein the second wafer comprises a second substrate, a second insulating layer located on the second substrate, a second metal layer embedded in the second insulating layer, a uniform metal layer located above the second metal layer and electrically connected to the second metal layer, and a second passivation layer located on the uniform metal layer, the second metal layer and the first metal layer are made of different materials, the uniform metal layer and the first metal layer are made of a same material, and the first passivation layer is bonded to the second passivation layer;
    a through silicon via (TSV) hole, wherein the TSV hole penetrates through the first wafer and the second passivation layer, and the TSV hole is located above the uniform metal layer; and an interconnection layer, wherein the TSV hole is filled with the interconnection layer, and the interconnection layer is electrically connected to the first metal layer and the uniform metal layer.

11. The semiconductor device according to claim 10, wherein the second wafer further comprises a first isolation layer covering the second metal layer, a contact hole penetrating the first isolation layer and located above the second metal layer, a plug with which the contact hole is filled and which is electrically connected to the second metal layer, a second isolation layer covering the first isolation layer and the plug, and an opening penetrating the second isolation layer and located above the plug, and the opening is filled with the uniform metal layer.

12. The semiconductor device according to claim 10, wherein the TSV hole comprises:
    a first opening, wherein the first opening penetrates through a portion of the first substrate;
    a second opening, wherein the second opening communicates with the first opening, and the second opening penetrates through the first wafer and the second passivation layer and exposes the uniform metal layer; and
    a third opening, wherein the third opening communicates with the first opening and the second opening, and the third opening penetrates through the first substrate and a portion of the first insulating layer to expose a portion of the first metal layer.

13. The semiconductor device according to claim 12, wherein a size of the third opening is greater than a size of the second opening and smaller than a size of the first opening.

14. The semiconductor device according to claim 10, further comprising a barrier layer, wherein the barrier layer covers side walls and a bottom surface of the TSV hole and exposes the first metal layer.

15. The semiconductor device according to claim 10, wherein the first passivation layer comprises a first passivation layer first portion located above the first metal layer and a first passivation layer second portion located on the first passivation layer first portion, wherein the first passivation layer first portion is a silicon oxide layer and the first passivation layer second portion is a silicon nitride layer.

16. The semiconductor device according to claim 10, wherein the second passivation layer comprises a second passivation layer first portion located on the uniform metal layer and a second passivation layer second portion located on the second passivation layer first portion, wherein the second passivation layer first portion is a silicon oxide layer and the second passivation layer second portion is a silicon nitride layer.

* * * * *